(12) United States Patent
Chang et al.

(10) Patent No.: US 7,051,800 B2
(45) Date of Patent: May 30, 2006

(54) HOT PLATE COOLING SYSTEM

(75) Inventors: Ching-Yu Chang, Yilan Hsien (TW); I-Pien Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/727,946

(22) Filed: Dec. 1, 2000

(65) Prior Publication Data

US 2002/0020520 A1 Feb. 21, 2002

(30) Foreign Application Priority Data

Aug. 17, 2000 (TW) .......................... 89116611 A

(51) Int. Cl.
*F28F 3/12* (2006.01)

(52) U.S. Cl. .................. 165/168; 165/80.4; 165/80.5
(58) Field of Classification Search ............... 165/168, 165/171, 80.4, 80.5, 170; 257/714; 361/699; 359/845

See application file for complete search history.

(56) References Cited

U.S. PATENT DOCUMENTS

| | | | | |
|---|---|---|---|---|
| 4,003,641 A | * | 1/1977 | Heinz et al. ................. | 359/845 |
| 4,003,687 A | * | 1/1977 | Hedin ......................... | 165/168 |
| 4,006,972 A | * | 2/1977 | Nachtman .................... | 359/845 |
| 4,013,062 A | * | 3/1977 | Laird .......................... | 165/171 |
| 4,628,991 A | * | 12/1986 | Hsiao et al. ............. | 165/168 X |
| 5,034,688 A | * | 7/1991 | Moulene et al. ............ | 165/80.4 |
| 5,168,924 A | * | 12/1992 | Taylor ......................... | 165/168 |
| 5,209,291 A | * | 5/1993 | Taylor ......................... | 165/168 |
| 5,484,015 A | * | 1/1996 | Kyees .......................... | 165/168 |
| 5,582,238 A | * | 12/1996 | Plaschkes .................... | 165/171 |
| 5,846,375 A | * | 12/1998 | Gilchrist et al. ............ | 165/80.4 |

* cited by examiner

*Primary Examiner*—Leonard Leo
(74) *Attorney, Agent, or Firm*—J.C. Patents

(57) ABSTRACT

A cooling system for a hot plate. The cooling system includes a plurality of pipelines inside the hot plate. Each pipeline has an inlet and an outlet. The inlet permits a cooling fluid to enter and the outlet permits the cooling fluid to leave. The cooling fluid running inside the pipelines picks up heat from the hot plate and carries away so that the hot plate is cooled.

8 Claims, 2 Drawing Sheets

HOT PLATE COOLING SYSTEM

CROSS-REFERENCE TO RELATED APPLICATION

This application claims the priority benefit of Taiwan application Ser. No. 89116611, filed Aug. 17, 2000.

BACKGROUND OF THE INVENTION

1. Field of Invention

The present invention relates to a hot plate cooling system. More particularly, the present invention relates to the cooling system inside a hot plate to be used mainly in rapid thermal processing, baking and chemical vapor deposition for rapidly cooling the hot plate after heating.

2. Description of Related Art

In the manufacturing of integrated circuits, a silicon wafer has to go through a series of thermal operations. Besides growing thin films, other processes such as diffusion and photoresist baking also require heating as well. In addition, semiconductor fabrication also involves many thermal treatments including annealing or heat reflow operation. In general, thermal oxidation, annealing, heat reflow, diffusion and material curing operations are conducted in a furnace. However, photoresist baking is usually conducted on a hot plate instead of inside a furnace. Photoresist baking is a low temperature (at about 200° C.) heat solidification process. To facilitate incorporation with other photolithographic processes and to prevent uneven vaporization of solvent inside the photoresist, a soft baking, post exposure baking and hard baking are all conducted using a hot plate.

FIGS. 1A and 1B show respectively the top view and the side view of a conventional hot plate. As shown in FIGS. 1A and 1B, a conventional hot plate uses natural convection current for cooling. Natural convection cooling is able to achieve a cooling rate of about 0.8° C. per minute on average. Therefore, lowering the hot plate by 40° C. requires about 50 minutes.

After treating a batch of wafers, the hot plate needs to be cooled by natural convection because temperature of the hot plate is not too high. However, natural convection cooling is relatively slow process and hence the next batch of wafers has to be put aside for the long wait while the hot plate cools down.

SUMMARY OF THE INVENTION

Accordingly, one object of the present invention is to provide a rapid cooling system inside a hot plate so that temperature of the hot plate can be lowered within a relatively short period.

A second object of this invention is to provide a rapid cooling system inside a hot plate so that the hot plate can be cooled rapidly so that overall processing time can be reduced.

A third object of this invention is to provide cooling pipelines inside a hot plate so that the heat can be rapidly channel away by running liquid or air within the pipelines.

To achieve these and other advantages and in accordance with the purpose of the invention, as embodied and broadly described herein, the invention provides a cooling system inside a hot plate. A plurality of pipelines is laid inside the hot plate. A sealed close-loop non-crossing pipeline system is used so that flow interference is avoided. Each pipeline has an inlet and an outlet. Cooling fluid enters each pipeline from the inlet. After flowing through an interior section of the hot plate or interior of the entire hot plate, the cooling fluid exhausts from the outlet. The liquid flowing through the interior of the hot plate picks up heat from the hot plate and the hot plate rapidly cools. The cooling fluid can be a liquid or a gas. Cooling gas and liquid include air, nitrogen, carbon dioxide, inert gas, water and various cooling and heating media. In addition, a valve may be added to the inlet for controlling the amount of fluid flowing into the cooling plate and hence the cooling rate of the hot plate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figures 1A, 1B:
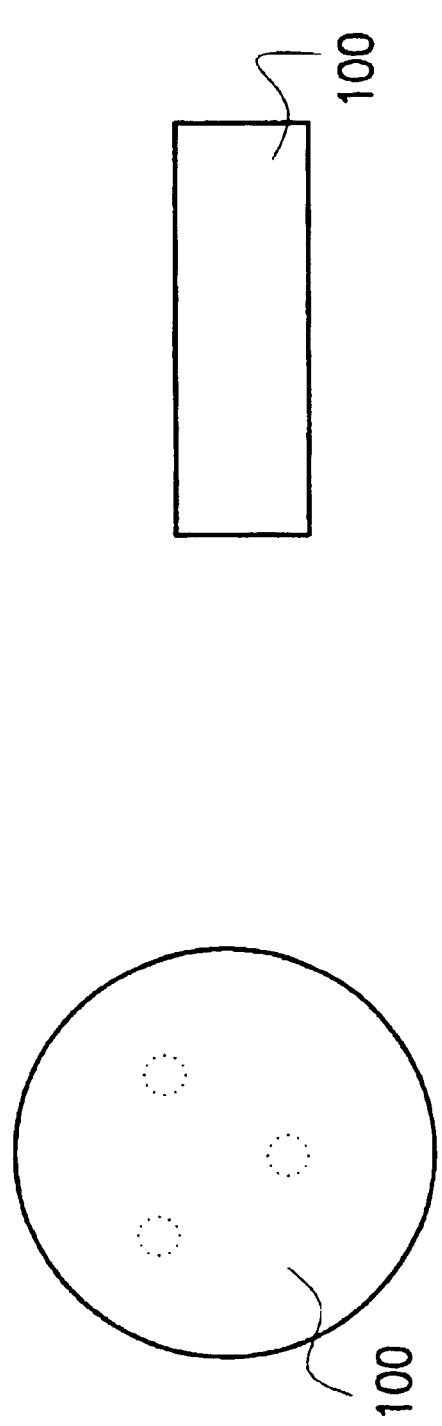
FIGS. 1A and 1B show respectively the top view and the side view of a conventional hot plate.

Reference will now be made in detail to the present preferred embodiments of the invention, examples of which are illustrated in the accompanying drawings. Wherever possible, the same reference numbers are used in the drawings and the description to refer to the same or like parts.

Figures 2A, 2B:
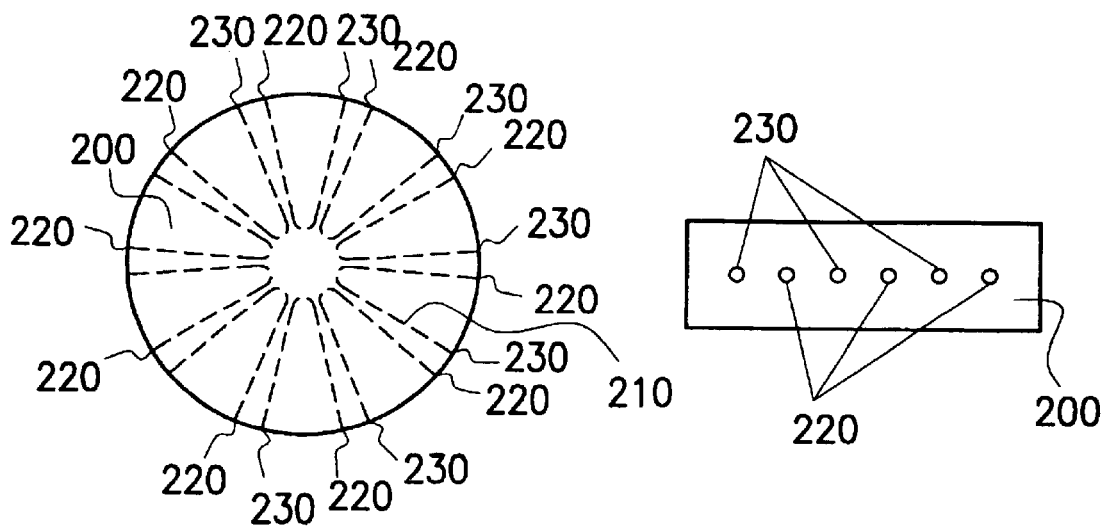
FIGS. 2A and 2B shown respectively the top view and the side view of a hot plate according to a first preferred embodiment of this invention.

FIGS. 2A and 2B shown respectively the top view and the side view of a hot plate according to a first preferred embodiment of this invention. As shown in FIG. 2A, a plurality of pipelines 210 is laid inside the hot plate 200. A sealed close-loop non-crossing pipeline system is used so that flow interference is avoided. Each pipeline 210 has an inlet 220 and an outlet 230. Cooling fluid enters each pipeline from the inlet 220. After flowing through an interior section of the hot plate 200 or interior of the entire hot plate 200, the cooling fluid exhausts from the outlet 230. The liquid flowing through the interior of the hot plate 200 picks up heat from the hot plate and the hot plate rapidly cools. The cooling fluid can be a liquid or a gas. Cooling gas and liquid include air, nitrogen, carbon dioxide, inert gas, water and various cooling and heating media. In addition, a valve (not shown) may be added to the inlet 220 for controlling the amount of fluid flowing into the hot plate 200 and hence controlling the cooling rate of the hot plate 200.

The alternating arrangement of the fluid inlets 220 and outlets 230 on the side of the hot plate 200 is shown in FIG. 2B.

Figures 3A, 3B:
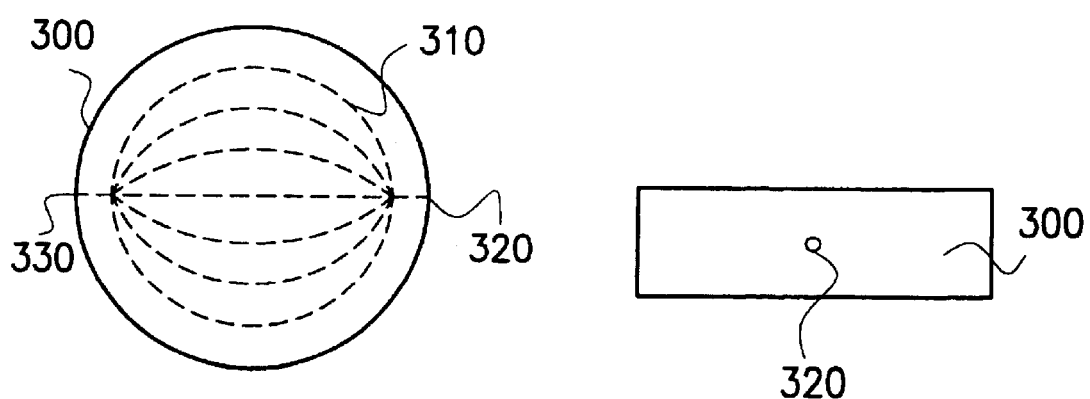
FIGS. 3A and 3B shown respectively the top view and the side view of a hot plate according to a second preferred embodiment of this invention.

FIGS. 3A and 3B shown respectively the top view and the side view of a hot plate according to a second preferred embodiment of this invention. As shown in FIG. 3A, a plurality of pipelines 310 is laid inside the hot plate 300. A close-loop pipeline system is used so that flow interference is avoided. The ends of the pipelines 310 are joined together to form a common inlet 320 and a common outlet 330 respectively. Cooling fluid enters the pipeline system via the inlet 320 and branches out to the pipelines 310. After flowing through an interior section of the hot plate 300 or interior of the entire hot plate 300, the cooling fluid merges and exhausts from the outlet 330. The liquid flowing through the interior of the hot plate 300 picks up heat from the hot plate and the hot plate rapidly cools. The cooling fluid can be a liquid or a gas. Cooling gas and liquid include air, nitrogen, carbon dioxide, inert gas, water and various cooling and heating media. In addition, a valve (not shown) may be added to the inlet 320 for controlling the amount of fluid flowing into the hot plate 300 and hence controlling the cooling rate of the hot plate 300.

In the invention, two layout designs for the cooling pipelines inside the hot plate are described. However, these are by no means the only layout of pipelines in the cooling system. Other cooling pipeline layouts using different cooling fluid for increasing the cooling rate is also possible.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cooling system for a hot plate, comprising:
   a hot plate having a plurality of radially arranged internal pipelines, wherein each pipeline has an inlet and an outlet positioned adjacent to each other and along a plane parallel to the hot plate, and wherein each pipeline is separate from the other pipeline.

2. The cooling system of claim 1, wherein the cooling fluid is a gas.

3. The cooling system of claim 2, wherein the cooling gas is selected from a group consisting of air, nitrogen, carbon dioxide and inert gas.

4. The cooling system of claim 1, wherein the cooling fluid is a liquid.

5. The cooling system of claim 4, wherein the cooling liquid is selected from a group consisting of water, cold medium or hot medium.

6. The cooling system of claim 1, wherein the cooling fluid is a mixture of gas and liquid.

7. The cooling system of claim 6, wherein the mixture of gas and liquid is selected from a group consisting of air, nitrogen, carbon dioxide, inert gas, water, cold medium and hot medium.

8. The system of claim 1, wherein the inlet and the outlet of each pipeline are on a same side or within a same quadrant of the hot plate.

* * * * *